United States Patent [19]

Holscher et al.

[11] 4,301,471
[45] Nov. 17, 1981

[54] MOVING TARGET INDICATOR SYSTEM UTILIZING CHARGE COUPLED DEVICE

[75] Inventors: Donald J. Holscher, Playa Del Rey; Donald E. French, West Lake Village, both of Calif.

[73] Assignee: Hughes Aircraft Company, Culver City, Calif.

[21] Appl. No.: 9,988

[22] Filed: Feb. 5, 1979

Related U.S. Application Data

[63] Continuation of Ser. No. 756,588, Dec. 20, 1976, abandoned.

[51] Int. Cl.³ .............................................. H04N 7/18
[52] U.S. Cl. .................................. 358/105; 250/578; 307/221 C; 358/212; 358/213
[58] Field of Search ...................... 358/105, 212, 213; 250/578; 307/221 C

[56] References Cited

U.S. PATENT DOCUMENTS

| | | | |
|---|---|---|---|
| 3,806,729 | 4/1974 | Caywood | 307/221 C |
| 3,851,096 | 11/1974 | Collins et al. | 358/105 |
| 3,856,989 | 12/1974 | Weimer | 250/578 |
| 3,942,022 | 3/1976 | Stumpf et al. | 250/578 |
| 4,011,441 | 3/1977 | Michon et al. | 358/213 |
| 4,031,315 | 6/1977 | Pfleiderer | 358/213 |
| 4,035,629 | 7/1977 | Lampe et al. | 307/221 D |
| 4,045,817 | 8/1977 | Nakatani | 358/213 |
| 4,064,533 | 12/1977 | Lampe et al. | 358/105 |

FOREIGN PATENT DOCUMENTS 2657299  6/1977  Fed. Rep. of Germany .

OTHER PUBLICATIONS

Buchanon et al; CCD 75 Proceedings, Int. Conf. on CCD's; San Diego, CA; 10-1975, pp. 209-215.
Breitzmann et al; 1976 IEEE Int. Solid-State Circuits Conf. Digest of Tech. Papers; 2-1976; pp. 36, 37.
Electronics, Oct. 31, 1974, pp. 4E, 6E.

*Primary Examiner*—S. C. Buczinski
*Attorney, Agent, or Firm*—Walter J. Adam; William H. MacAllister

[57] ABSTRACT

A time change or moving target indication system utilizing charge-coupled devices (CCD's) for signal processing in which successive integrated samples from individual detectors are loaded into adjacent CCD storage buckets and then clocked to an output device. The output device is any suitable differencing arrangement which samples the charge stored in adjacent buckets and gives an output proportional to the difference. The system of the invention allows the successive signals from individual detectors to pass through virtually identical elements in the signal processing chain so as to reduce the effects of transfer inefficiency on the accuracy of the MTI subtraction process. Further, the signal spectrum from an individual detector output may be shifted to higher frequencies during the readout process so as to reduce the effects of any 1/f noise that may be present in the output device. The concept, in accordance with the invention, may be implemented off the focal plane as well as on the focal plane and may be implemented for a single row of detectors or for a detector array. In the off-focal plane configuration in accordance with the invention, the detectors are sampled at a rate much higher than the system field time to provide a high signal bandwidth which permits additional signal processing such as noise spike suppression and background subtraction to be performed before subsequently integrating the samples from individual detectors over the desired field time.

10 Claims, 18 Drawing Figures

MOVING TARGET INDICATOR SYSTEM UTILIZING CHARGE COUPLED DEVICE

This is a continuation of application Ser. No. 756,588 filed Dec. 20, 1976, now abandoned.

BACKGROUND OF THE INVENTION

1. Field of the Invention

This invention relates to time change or moving target indication signal processing and particularly to a processing system utilizing charge-coupled devices to provide simplified, accurate and highly reliable processing.

2. Description of the Prior Art

Frame-to-frame subtraction concepts for performing MTI (moving target indication) with either visible or infrared detector arrays such as staring electro optical sensors, have previously required a separate analog or digital memory to store the first field prior to the readout and subtraction from the second field. The conventional subtraction arrangement has a limited accuracy because all signals do not follow the same electronic paths and because of the limited bandwidth. A moving target indication system that compares one field to the other of the scene being interrogated by transferring the signals through essentially a common path of storage elements would provide an arrangement that develops a highly accurate difference value with a minimum of equipment.

SUMMARY OF THE INVENTION

The moving target indicator (MTI) processing system of the invention loads successive integrated samples, each representing a different time field, from individual detectors into adjacent CCD (charge-coupled device) storage buckets and then clocks them to a suitable output device for developing difference signals between the different fields from each detector. The output device may be a CCD differencing circuit or a differential amplifier either of which samples the charge stored in adjacent CCD buckets and gives an output proportional to the difference. The system allows the successive signals from individual detectors to pass through virtually identical elements in the signal processing chain thereby reducing the effects of transfer ineffeciencies on the accuracy of the differencing or MTI process and permitting high subtraction accuracies. In one arrangement, in accordance with the invention, the processing is performed on the focal plane and in the second arrangement the processing is performed off the focal plane allowing the detectors to be sampled at a rate which is much higher than the system field time. The high signal bandwidth permits additional signal processing to be performed before subsequently integrating the samples and performing the differencing. In the off-focal plane arrangement the signals which represent sub-fields from a row or plurality of rows of detectors are shifted in parallel into a CCD multiplexer and are read out through the intermediate signal processing into an off focal plane CCD register of similar construction. The sub-field signals are then shifted in parallel into storage registers which integrate successive input sub-field samples for a field time. After both fields are integrated, the contents of the integrating registers are read out through the differencing arrangement to provide the difference or MTI signals.

It is therefore an object of this invention to provide a simplified and highly accurate time change or moving target indicator system.

It is another object of this invention to provide a moving target indicator system utilizing CCDs for use with staring electro optical sensors.

It is a further object of this invention to provide moving target indicator systems that may be utilized either on the detector focal plane or partly off of the detector focal plane.

It is still another object of this invention to provide a moving target indication concept utilizing charge-coupled devices that provides a high signal bandwidth for signal processing.

It is another object of this invention to provide a CCD MTI system that is compatible with other CCD processing and signal handling devices.

BRIEF DESCRIPTION OF THE DRAWINGS

These and other objects, features and advantages of the invention as well as the invention itself will become more apparent to those skilled in the art in the light of the following detailed description taken in consideration with the accompanying drawings wherein like reference numerals indicate like or corresponding parts throughout the several views wherein.

DESCRIPTION OF THE PREFERRED EMBODIMENT

Figure 1A:
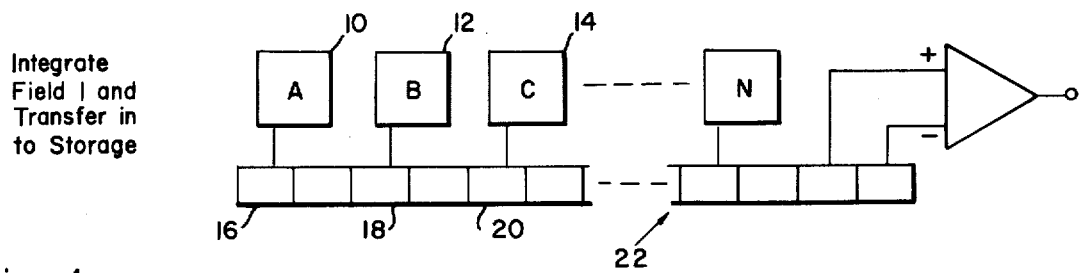
FIGS. 1a, 1b and 1c are schematic block diagrams showing the MTI concept in accordance with the invention for one detector row with a two-bit per detector cell CCD structure that may be utilized on the detector focal plane, showing three conditions for explaining the concept in accordance with the invention.
Figure 1B:
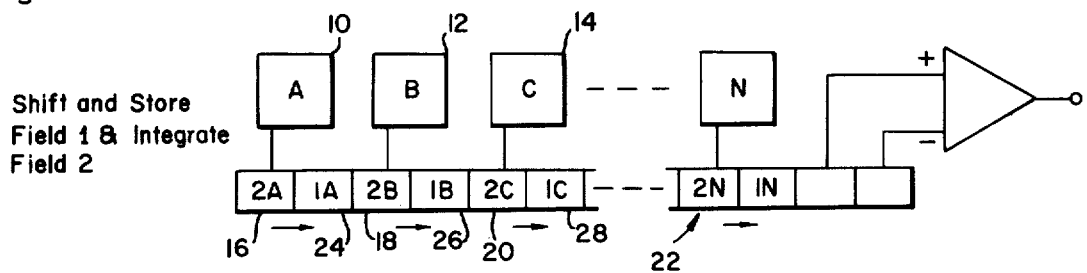
Figure 1C:
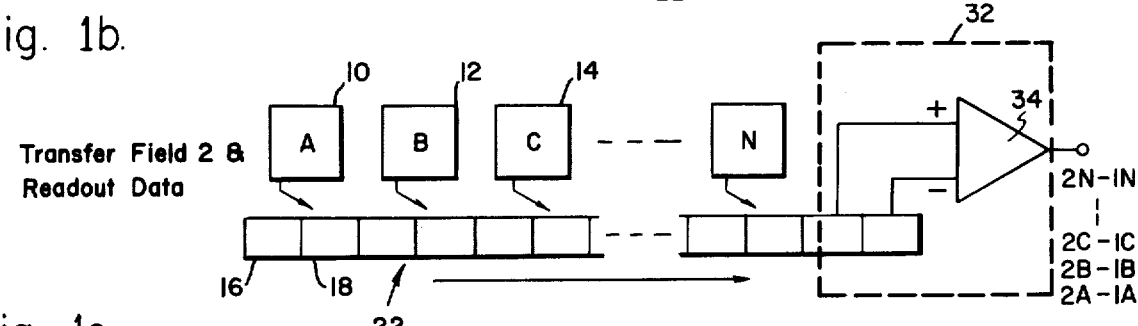

Referring first to FIGS. 1a to 1c, FIG. 1a shows the condition for integrating field one and transferring the integrated value from each detector into storage. The fields (or sub-fields) for the purpose of this invention refer to time intervals during which sensors or detectors such as staring detectors are receiving signals from a scene. Detectors such as 10, 12 and 14, also respectively designated A, B and C may, in accordance with the invention, be combined with integrating buckets or CCD charge storage wells and for the first field, which represents return from a field being sensed during a first interval of time, the integrated outputs of the detectors 10, 12 and 14 are applied to storage bucket units 16, 18 and 20 in a CCD storage and readout register 22. The concepts of the invention include both P and N-type CCD channels so that references to charges includes both hole carriers and electrons. In the illustrated arrangement of the invention, 2 bits are utilized for each illustrated CCD bucket unit with each of the storage units 16, 18 and 20 including 2 bit positions. After integrated field one has been transferred and stored in register 22, as shown in FIG. 1b, the contents of the storage units 16, 18 and 20 are shifted two bit positions to storage units 24, 26 and 28 and field two after integration is transferred and stored in storage units 16, 18 and 20 from respective detectors 10, 12 and 14. The next operation as shown in FIG. 1c, with fields one and two for each detector sequentially stored in the storage unit and with isolation bits between each signal charge packet, is to read out the data by transferring it along the register 22 and providing an output proportional to the difference by a differencing circuit 32 which, for example, may be a differential amplifier 34 coupled to adjacent storage units of the register 22. The differencing circuit 32 may also be a suitable CCD differencing arrangement such as described in Ser. No. 723,356, Charge Coupled Device Subtractor, filed Sept. 15, 1976 by Paul R. Prince. The detectors such as 10, 12 and 14 are shown disconnected from the register 22 during the readout process. The outputs from the differencing circuit 32 are 2N-1N . . . , 2C-1C, 2B-1B and 2A-1A.

Figure 2:
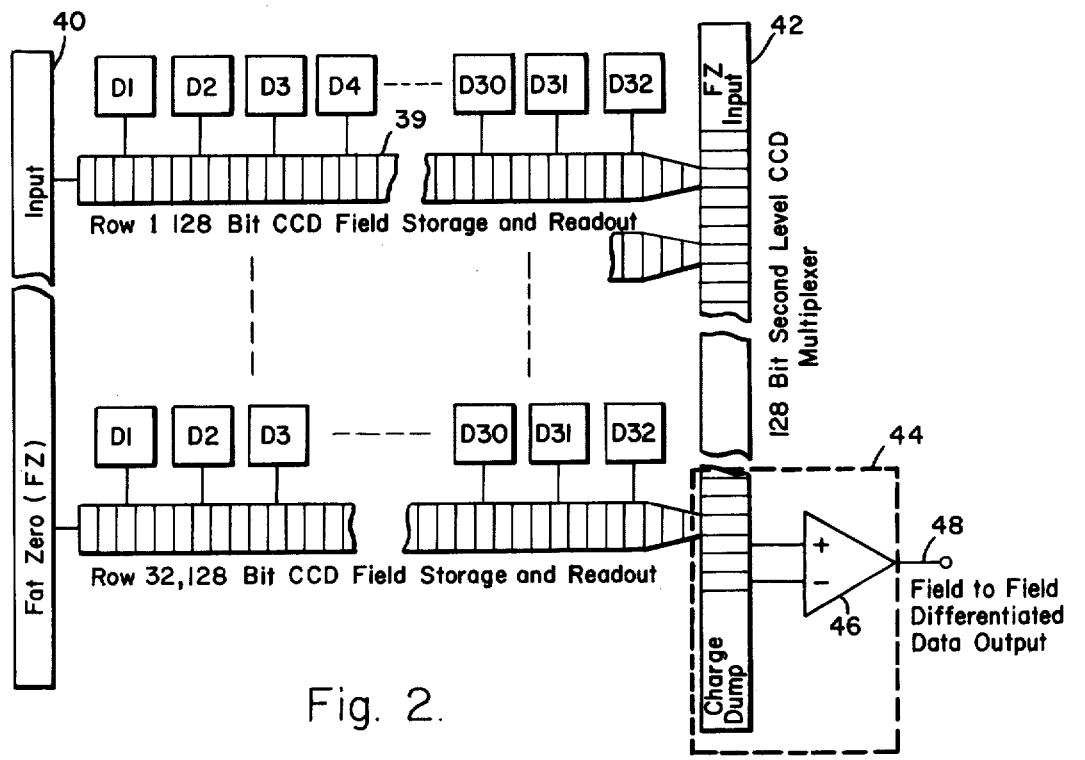
FIG. 2 is a schematic block diagram illustrating a 32×32 detector array for an on-focal plane array providing the MTI function in accordance with the invention.

Referring now to FIG. 2, a 32×32 detector array mechanization of the principles illustrated in FIG. 1 is shown for an on-focal plane arrangement of the invention. Field storage and readout registers for rows 1 to 32 are shown each having 128 bit CCD positions and each receiving charges from a corresponding row of detectors D1 to D32. The transfer positions of adjacent detectors such as D1 and D2 are separated by 3 bit positions. At the input to each field storage and readout register, such as 39 for row 1, is a fat zero (FZ) source 40, as is well known in the art. Each of the storage registers transfers its charge to a 128 bit second level CCD multiplexer register 42 having a fat zero (FZ) input at a first end and charge dump arrangement, as well known in the art, at the second end. Each of the row storage registers in the illustrated arrangement receive two integrated fields with one isolation bit therebetween so that there are 4 bits utilized for each detector cell. Isolation bits reduce the effect of transfer inefficiency in the CCD operation. Thus, in the array there are thirty-two 128 bit row registers. The output multiplexer includes 128 bits for receiving both fields 1 and 2 and it applies the signal charges to a field charge differencing circuit 44 which is illustrated as a differential amplifier 46 coupled to 2 bit positions separated by an isolation bit to provide a difference data output to an output lead 48. The differencing circuit 44 may be any suitable arrangement such as the CCD subtractor circuit to which reference was previously made.

Figure 3:
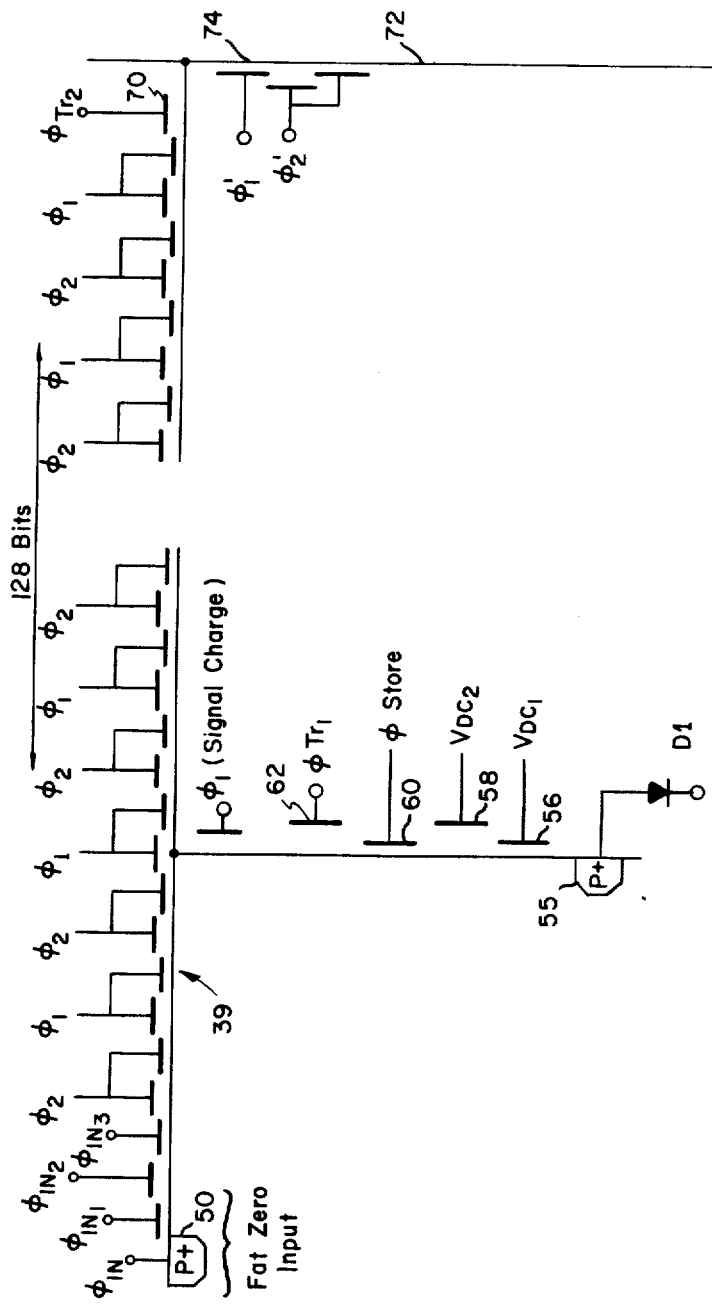
FIG. 3 is a schematic circuit diagram showing the CCD electrodes for further explaining the operation of the system of FIG. 2.
Figure 3:
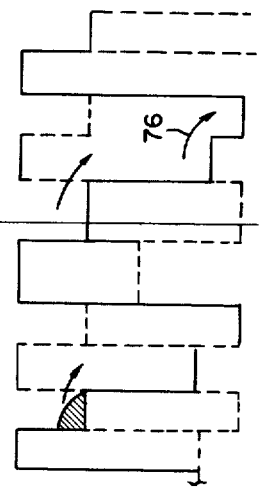
Figure 3A:
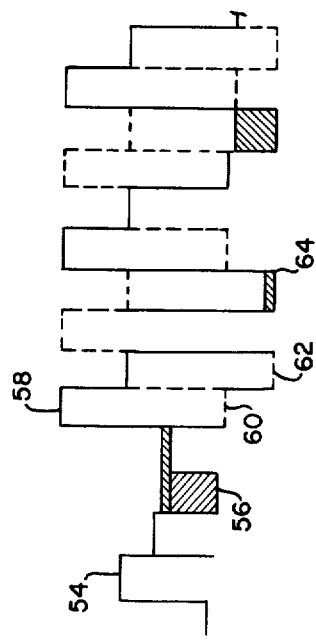
FIG. 3a is a schematic diagram showing the surface potentials developed by the arrangement of FIG. 3.

Referring now also to FIG. 3, which shows a section through the FZ input 40, the row 1 readout register 39, a portion of the multiplexer 42 and the detector and integrating bucket, and referring to the surface potentials of FIG. 3a, the operation will be explained in further detail. The storage register 39 operates by receiving an integrated charge from all the detectors for a first field, shifting the field data by two bit positions, receiving the integrated charges for field 2 and transferring the first and second fields of detector column D32 data in bursts of 4 bits to the multiplexer register 42. Any suitable electrode channel-driving arrangement may be utilized in accordance with the invention but the illustrated arrangement is a two-phase driving system in which a $\phi_1$ pulse is up while a $\phi_2$ pulse is down and vice-versa. The FZ input for a CCD N-channel includes a P+ diffusion region 50 responsive to a $\phi_{IN}$ pulse and electrodes receiving potential $\phi_{IN1}$, $\phi_{IN2}$ and $\phi_{IN3}$ which may be DC. The $\phi_{IN3}$ electrode is followed by a $\phi_2$ electrode pair and as can be seen in FIG. 3a, the $\phi_{IN}$ pulse indicated by a pulse 54 is followed by DC potentials so that a well 56 is maintained under the $\phi_{IN2}$ electrode and a charge overflow is provided under the $\phi_{IN3}$ electrode when the $\phi_2$ potential is high as shown at 58. When the $\phi_2$ pulse goes low, as shown at 60, and by the dotted voltage profile, a current charge is transferred to a well 62 and when the $\phi_1$ pulse goes low, the charge is transferred as a FZ value to a well 64. The FZ charge from the well 64 is transferred on down the row and signal charges from detectors therealong are combined therewith.

Figure 4A:
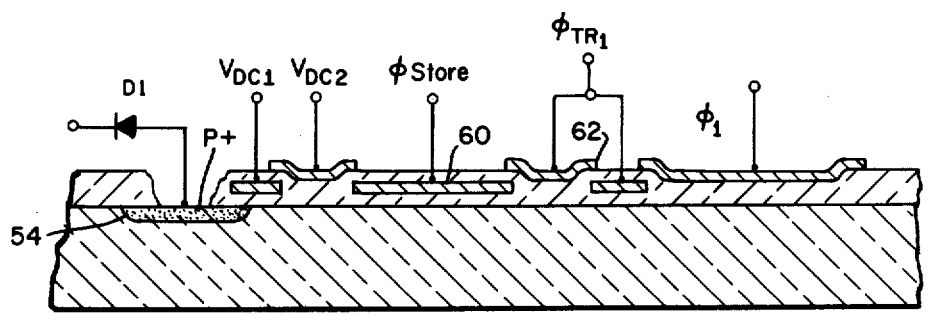
FIG. 4a is a schematic sectional view further showing the integrating structure at each detector in accordance with the invention.
Figure 4B:
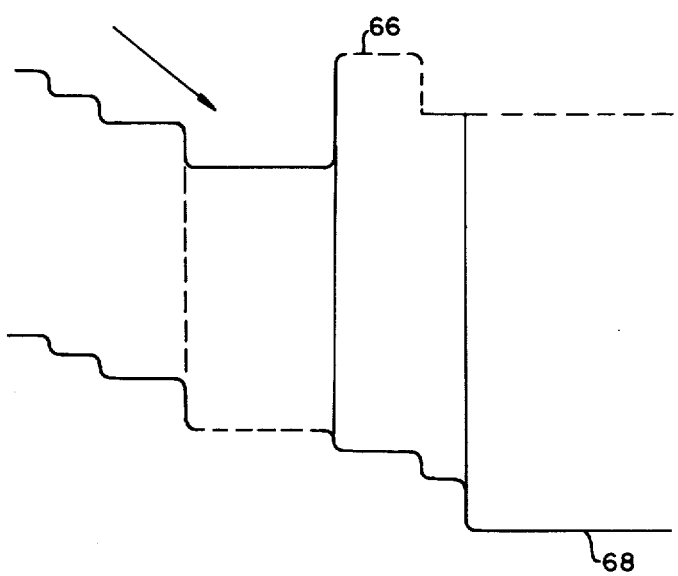
FIG. 4b is a schematic drawing showing the surface potentials provided by the electrodes of FIG. 3 during the charge integration operation of the system of the invention.

For the signal integration, a detector such as D1 applies current directly to a P+ diffusion region 55 with the current moving under electrodes 56 and 58 respectively labeled $V_{DC1}$, $V_{DC2}$ and being stored under store electrode 60 in response to a positive $\phi_{store}$ pulse. It is to be understood that other arrangements may be utilized to provide the detector read out such as CCD gate modulation input, for example, and the systems of the invention are not to be limited to the illustrated direct injection arrangements. The period of integration and storage of current from the detector D1 is a function of the period between transfers at an electrode 62 which responds to a $\phi_{TR1}$ pulse to transfer the detected charge into the row channel under the illustrated electrode receiving a $\phi_1$ pulse. As shown in FIGS. 4a and 4b, which illustrate a representative detector input circuit and the corresponding surface profile, the transfer gate potential is positive at 66 during the charge integration time and when the $\phi_{TR1}$ gate goes negative the charge is transferred into the main channel under a $\phi_1$ electrode as shown at 68. The transfer gate 62 may be a pair of electrodes as illustrated in FIG. 4a or may be a single electrode.

The charges are all transferred along the row with a 1 bit isolation bit to a $\phi_{TR2}$ electrode 70 adjacent to the second level multiplexer indicated by a line 72 and in response to the $\phi_{TR2}$ pulse going positive the charge is transferred under an electrode 74 while $\phi_1'$ is low. When $\phi_1'$ goes high and $\phi_2'$ goes low, the charge is transferred on down the second level multiplexer 42, as shown by an arrow 76. During each burst of transfer of 4 bits into the second level multiplexer, the bits in the second level multiplexer are transferred in response to a $\phi_1'$ and $\phi_2'$ clock of the same frequency to positions such that the charges pass therein with 1 bit separation or with one isolation bit.

Figure 5:
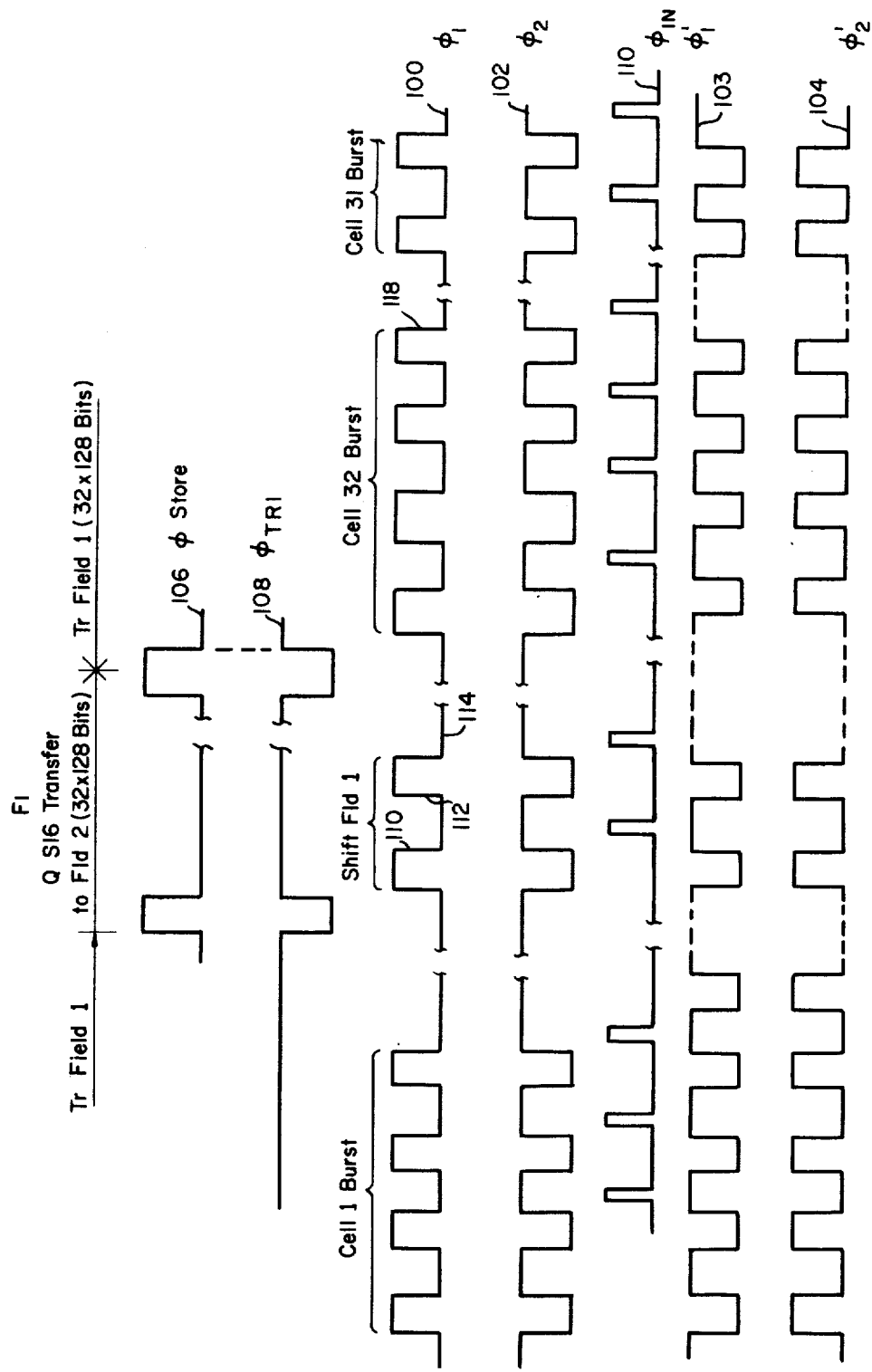
FIG. 5 is a schematic diagram of waveforms of voltage as a function of time for further explaining the operation of the system of FIG. 2.

Referring now to the waveforms of FIG. 5, the transfer operations will be explained in further detail. As shown by waveforms 100 and 102 representing $\phi_1$ and $\phi_2$, the cell 1 burst is completed for transferring the last of the field 1 and field 2 data into the second level multiplexer which has transfer clock pulses $\phi_1'$ and $\phi_2'$ at the same frequency as shown by respective waveforms 103 and 104. It is to be noted that the left cell 1 burst of waveforms 100 and 102 shows the last transfer out of the row registers of fields one and two data. Each burst of four pulses applied to the row registers is followed by an interval of a period of 128 bits as each of the 32 cells of data is transferred down the second level multiplexer 42 to provide a difference at the differencing circuit 44. Upon completion of this transfer of the first cell data for all of the rows, the cells 32 and 2 having been previously transferred, a $\phi_{store}$ pulse of a waveform 106 coincident with a $\phi_{TR1}$ pulse of waveform 108 transfers the integrated field 1 charges into the rows at all detector positions. Then, in response to $\phi_1$ and $\phi_2$ of respective waveforms 100 and 102, the row charge packets are transferred two bit positions or shifted as shown by pulses 110 and 112. This shifting operation is followed by a period during which field 2 data is integrated in the storage buckets at the detectors as shown at 114 and at the end of the field 2 time, the pulses of the waveforms 106 and 108 transfers the second field into the bit positions of all the rows of the array. It is to be noted that while field 2 is being integrated there are not any row transfer bursts of pulses or any data in the output multiplexer 42. The row registers now being loaded with the data from two fields, the cell 32 data is first transferred to the second level multiplexer 42 by a burst of four pulses as shown by the waveforms 100 and 102, followed by a period at 118 of transfer of 128 bits in the register 42 while the two fields in the multiplexer 42 are transferred out and to the differencing circuit 44 in response to $\phi_1'$ and $\phi_2'$. It is to be noted that the second level multiplexer clock of the waveforms 103 and 104 is continuous and at the same frequency as the clock of the waveforms 100 and 102 so that the alternate fields are transferred into the second multiplexer with one isolation bit separation and are then transferred on out of the register. Following the transfer of the cell 32 data out of the second level multiplexer register 42 another burst of 4 bits of the waveforms 100 and 102 transfers the cell 31 data for the two fields into the register 42, followed again by a 128 bit transfer period for transferring the two fields out of the register 42. After all 32 cells of data are transferred into and out of the register 42, field 1 integrated data is again transferred into the row registers and the operation is repeated. In the row transfers, the fat zero is continually formed in response to the $\phi_{IN}$ pulses of waveform 110.

Figure 6:
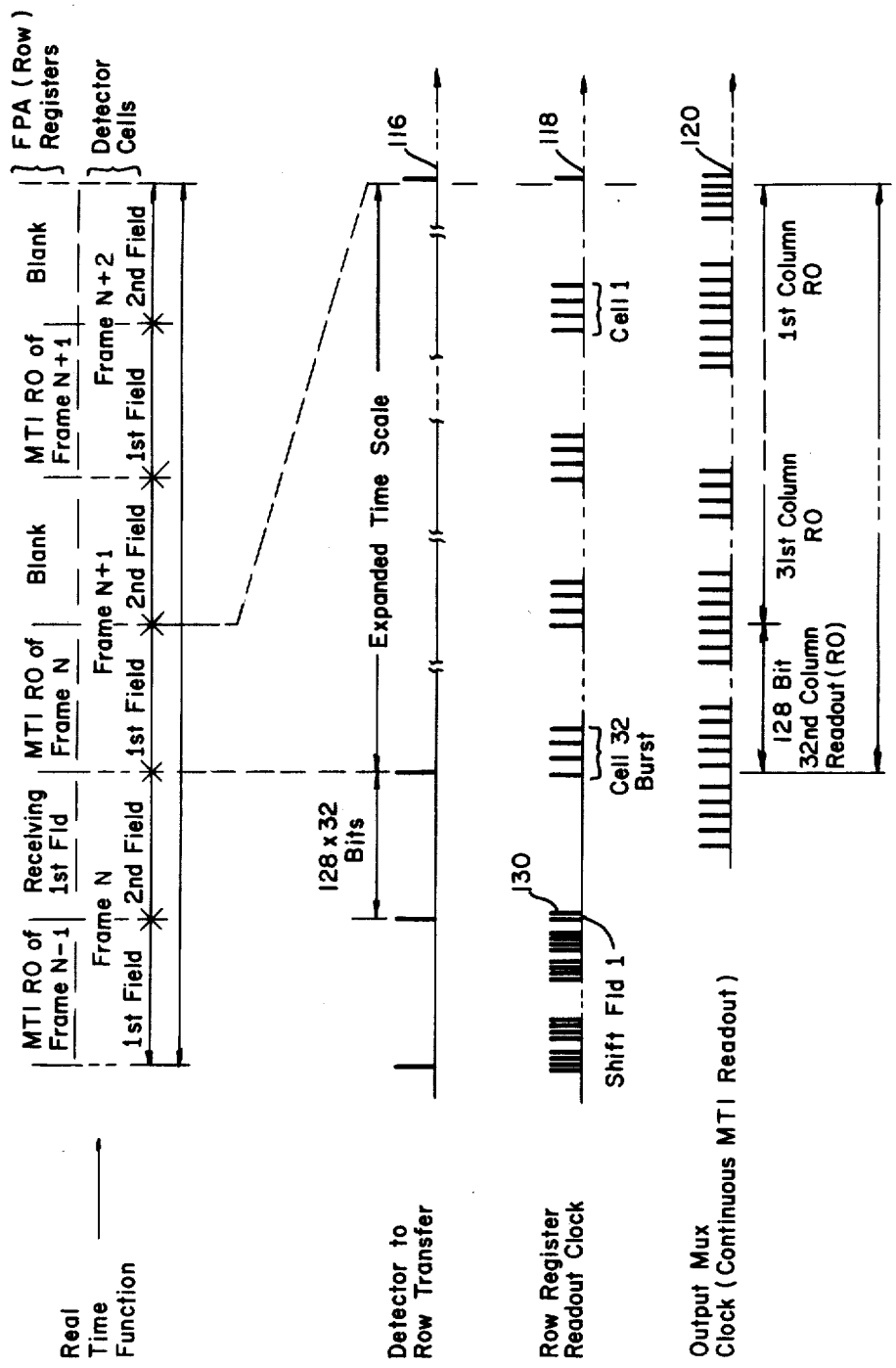
FIG. 6 is a schematic timing diagram of voltage as a function of time for further explaining the on-focal plane array moving target indication discrimination of FIG. 2.

For further explaining the overall operation, reference is now made also to FIG. 6, which shows several frames with the difference values being read out for the entire frame during the each first field time. The field times are defined by the detector fields. Looking at frame N, the first field is being integrated in the storage buckets at the detectors while the MTI readout of frame N−1 is being performed at the output of the second multiplexer register 42. In response to the detector to the row transfer pulse $\phi_{TR1}$ of a waveform 116, the first field is loaded into row registers at the end of the first field time. At this time, as shown by a waveform 118, field 1 charges are shifted 2 bit positions in response to a pulse 130 and during the second field time, transfer along the rows is performed. During the second field time, the second field is being integrated in the storage wells and at the end of the second field time of frame N, field 2 is loaded into the row registers in response to a pulse of the waveform 116. During the first field time of frame N+1 in response to the row register readout clock of waveform 118, bursts of 4 clocks are applied to the row registers, with the output multiplexing clock of the waveform 120 running continuously and with the transfer of each 4 bit positions into the second level multiplexing register 42 being followed by a 128 bit period to transfer each column into the differencing circuit 44. Thus, after the four transfer bits applied to the row 32, the row clock is terminated until 128 bits are applied to the output multiplexing clock, which in turn is followed by 4 bit burst of the waveform 118 applied to the row registers for transferring detector row 31 into the output register 42 followed by a 128 bit transfer in the output multiplexing clock. Thus, four bit transfer is the sequence continuing until the detector row 1 is transferred to the register 42 and to the differencing circuit. During the first field time of frame N+1, the detectors are integrating the new first field data which is transferred into the row registers at the end thereof, as shown by the waveform 116. Thus, the operation of the arrangement of FIG. 2 is continuous as integration of alternate fields is being continuously performed and during the first field times the row registers are responding to bursts of 4 clocks followed by 128 bit data transfers of the output multiplexer register 42.

Figure 7:
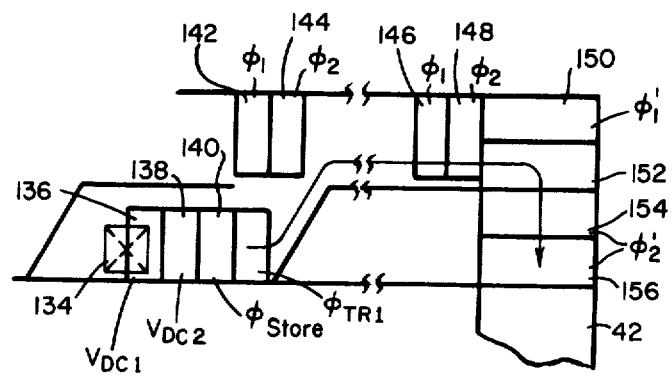
FIG. 7 is a schematic plan view showing the right angle transfer of charges from once source to another that may be utilized in the systems of the invention.

Referring now to FIG. 7, an illustration of the right angle transfers that may be utilized in the arrangements of the invention will be further explained showing a portion of the row 1 CCD register, a detector D32 input diffusion region and showing the $\phi_1$ and $\phi_2$ electrodes for transferring the row 1 charges to the output multiplexing register 42. A block 134 represents the diffusion region coupled to the detector D32 and electrodes 136, 138 and 140 respectively show $V_{DC1}$, $V_{DC2}$ and $\phi_{store}$ for integrating the charge or carries from the detector D1. Electrodes 142 and 144 in the row 1 channel respectively respond to $\phi_1$ and $\phi_2$ for the transfer along the channel as previously explained. At the position of the output multiplexer 42, electrodes 146 and 148 respectively receiving $\phi_1$ pulses and $\phi_{TR2}$ pulses transfer the charges into the well controlled by $\phi_1'$ shown as electrodes 150 and 152 followed by electrodes 154 and 156 receiving the $\phi_2'$ pulses. The arrangement of FIG. 7 may be utilized for any of the transfers in the arrangements of the invention. Transfer between registers such as the illustrated right angle transfer are well known in the art and will not be explained in further detail.

Figure 8:
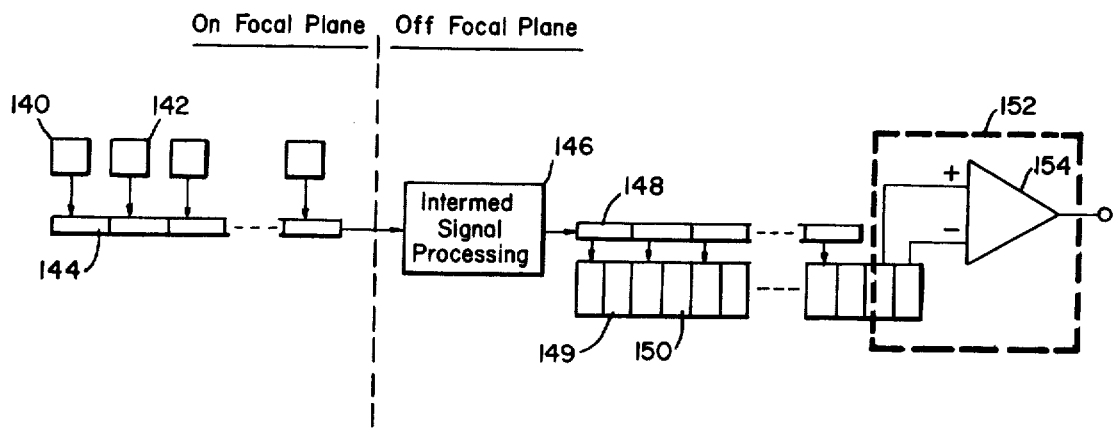
FIG. 8 is a schematic block diagram showing the off-focal plane processing system in accordance with the invention for a single row of detectors.

Referring now to FIG. 8, a single CCD channel is illustrated for explaining the off-focal plane configuration for the MTI concept in accordance with the invention. Detectors such as 140 and 142 detect energy and provide integration in integration buckets as previously explained. A CCD readout register 144 having 2 bits in each section or bucket union shown receives the charges from the detectors and in the illustrated arrangement receives a first sub-field, transfers the first sub-field data out of the register 144, followed by receiving a second sub-field, and transferring that data out of the register 144. If two sub-fields are used to form a field, the next two sub-fields out of the register 144 would be to form the second field. Off the focal plane, the signals are read out through an intermediate signal processing unit 146 into an off-focal plane CCD multiplexer register 148. The processing unit 146 may be utilized to perform processing such as noise spike suppression and background subtraction which most suitably is performed off the detector focal plane. The samples may then be shifted in parallel from the register 148 into a CCD integration register 150 which may be utilized in some arrangements in accordance with the invention to integrate successive input samples or sub-fields for a field time. After integrating the first field, the register would shift the accumulated field signals to the adjacent storage bucket units such as 149 having two bit positions, and integrate samples from the second sub-fields. The contents of the register 150 containing fields 1 and 2 separated by isolation bits are then read out through a differencing circuit 152, which may be any suitable arrangement such as a CCD differencing circuit, or as illustrated, a differential amplifier 154. It is to be noted that in the register 150, each section or unit represents two bits so that the isolation bit is provided between the signal charge packets. The output at the differencing circuit 152 thus is taken from the first and the third and register sections with the connected bit positions separated by one bit position.

Figure 9:
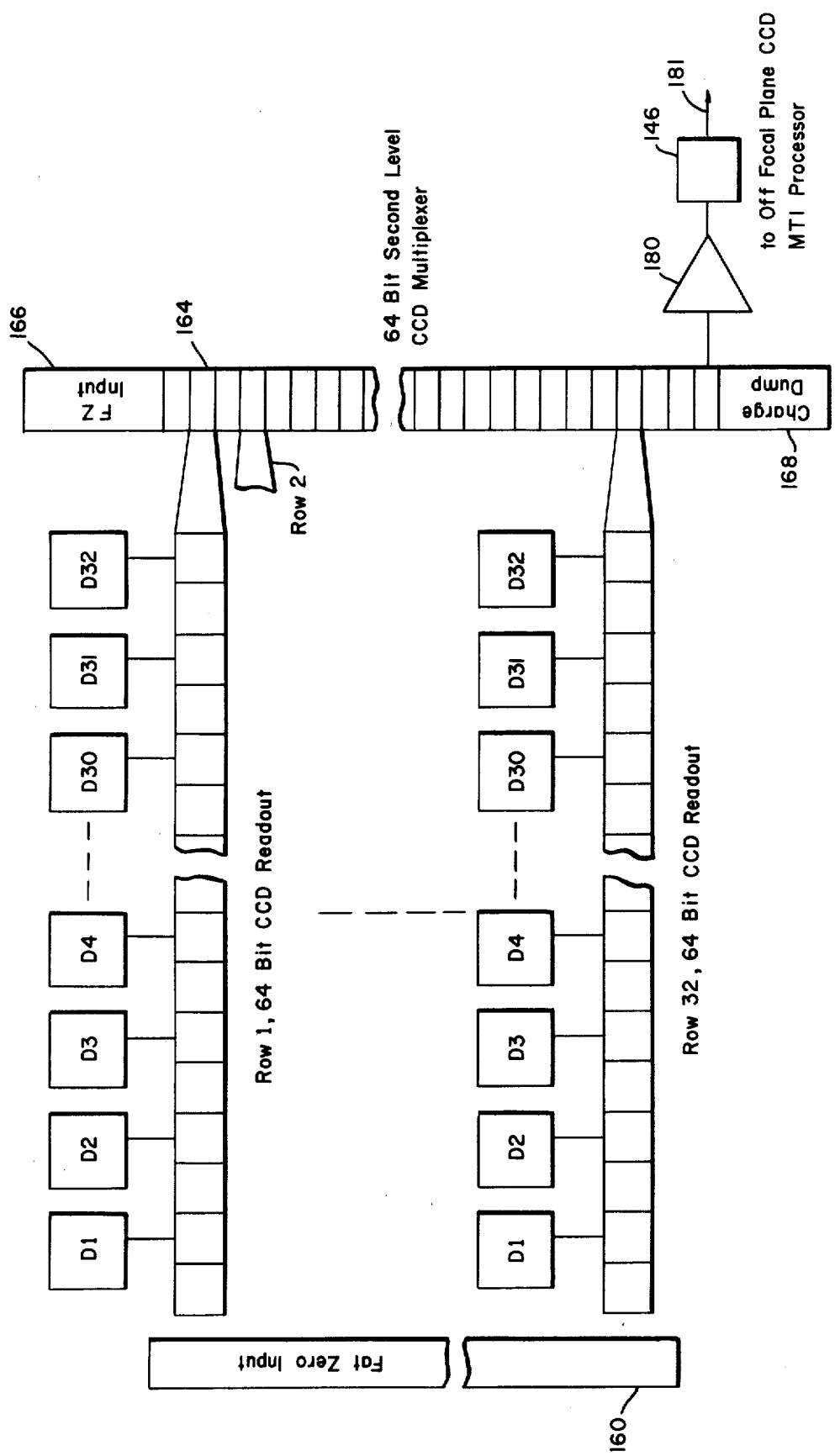
FIG. 9 is a schematic block diagram for illustrating a 32×32 detector array on the focal plane for the off-focal plane MTI processing system in accordance with the invention.

Referring now to FIG. 9, which shows a 32×32 detector array for the off-focal plane MTI system in accordance with the invention, detectors D1 to D32 are provided for 32 rows such as in a staring infrared detector array for example. Row 1 registers, row 2 registers and row 32 registers are shown receiving a FZ (fat zero) input from a source 160 similar to that previously explained, with each detector coupled to alternate bit positions so that an isolation bit is provided between the data transferred into the row registers. It is to be noted that in the arrangement for the off-focal plane MTI, all of field 1 data is first transferred into the row registers and shifted out of the 32 registers while field 2 is being integrated in the storage buckets, and field 2 is then transferred into the row registers and shifted out into a second level multiplexer CCD register 164. An FZ input 166 and a charged dump circuit 168 which may be a relatively large capacitor or a P+ diffusion region coupled to a suitable potential are provided in the second level multiplexer register 164. It is to be noted that the row registers such as row 1 and row 2 transfer their charges into alternate bit positions of the second level multiplexer register 164 which operates at the same clock frequency as the row registers so that the signal charges pass into the register 164 with an isolation bit therebetween. The register 164 is formed of 128 bit positions with the last bit coupled to an output amplifier 180 which in turn applies the data to the intermediate signal processing unit 146 from which it is transferred on a lead 181 to the off-focal plane MTI processor.

Figure 10:
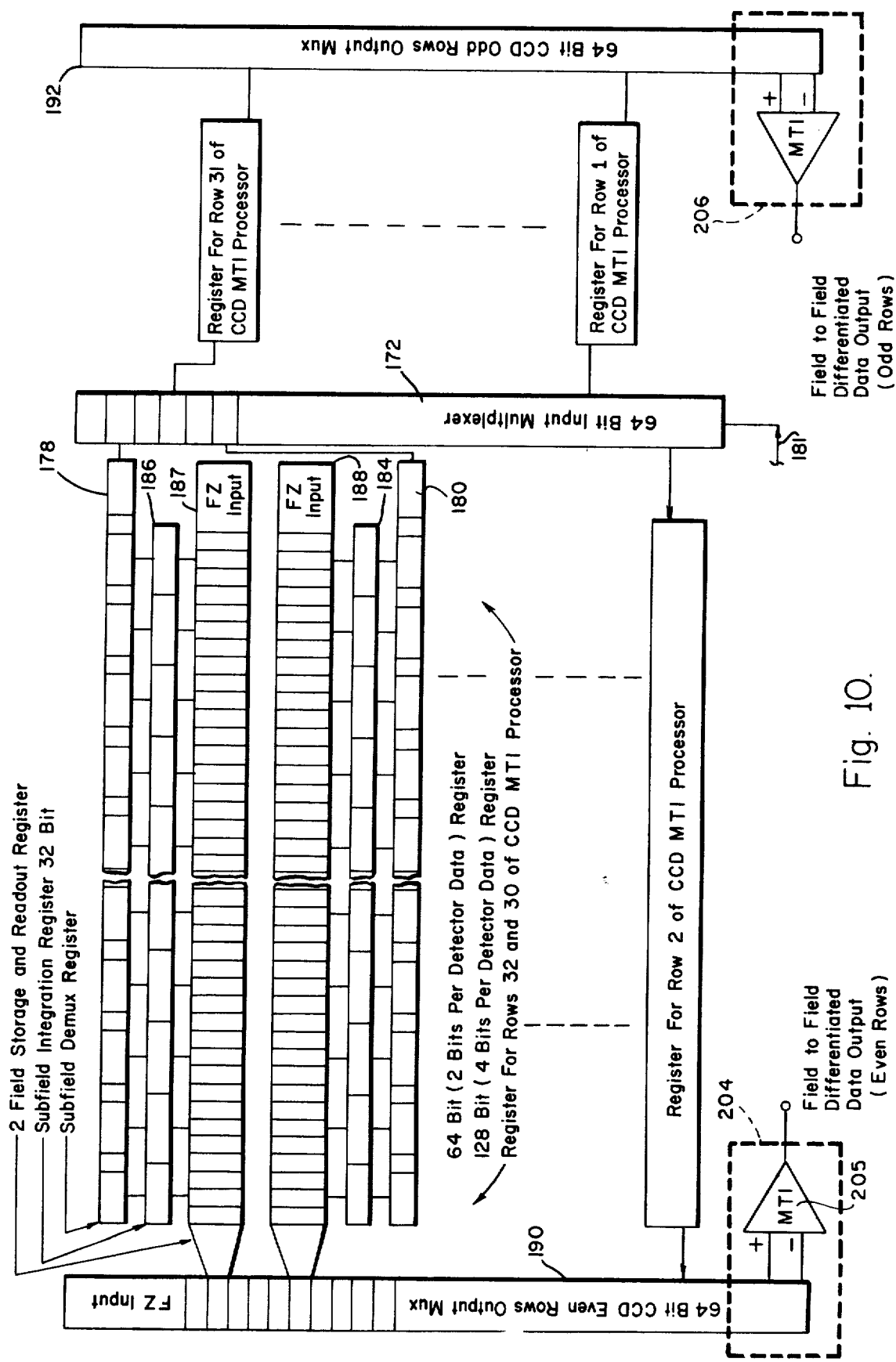
FIG. 10 is a schematic block diagram showing the other portion of the off-focal plane MTI processing system of FIG. 9.

Referring now to the processor of FIG. 10 which performs the off-focal plane processing of the 32×32 array of FIG. 9 with the even rows for processing the even detector row data on the left and the odd rows for processing the odd detector row data on the right of a 64 bit input multiplexer 172. The data from a column of detectors starting with detector 32 for field 1 is first transferred through the lead 181 into the input multiplexer register 172 followed by transfer of the detector 32 data for the 16 even rows to the left and for the odd rows to the right. The charges for each detector row such as row 32 is transferred from the register 172 into demultiplexing registers such as 178 and 180 which are 64 bit sub-field registers having 2 bit positions for each detector data charge. When the charges are positioned in the input multiplexer register 172, two clock pulses applied to the demultiplex registers such as 178 and 180 transfers them into the end position of the demultiplex register. The field 1 data for detector column D31 is then transferred into the input multiplexer register 172 and transferred into the demultiplexer registers 178 and 180. At the same time, the detector 32 charges for field 1 are transferred two bit positions to the left along the the demultiplex registers. After this transfer of the data of all the detector columns through detector column D1 is completed, the sub-field data for field 1 data in the demultiplexing register such as 178 is then transferred into sub-field integrating registers such as 184 and 186. The next sub-field for field 1 data is then transferred into registers, such as 172, one detector row at a time into demultiplex registers such as 178 and 180 and into the integrating registers such as 180 and 182 to complete the field 1 integration in a two sub-field system. The field 1 charges are then transferred into the two field storage and readout registers such as 187 and 188 and the charges are shifted over two bit positions in the readout registers.

The first sub-field of the second field of integrated data from the detector column is then applied to the demultiplex registers of rows 1 to row 32 and transferred into the integrating registers. After receiving the second sub-field, the field 2 data in the integrating registers such as 182 and 184 is then transferred into the readout registers such as 187 and 188. The field 1 and field 2 data in the readout registers such as 187 and 188 is then transferred into output multiplexer registers 190 and 192 in bursts of 4 bit transfers so that both fields of data appear in the output multiplexer registers with 1 bit of isolation therebetween. The clock controlling the output multiplexer register such as 190 is continuous and the difference for the even rows, one detector column at a time is provided at a differencing circuit 204 which may include a difference amplifier 205 or be a suitable CCD differencing arrangement as previously explained. In a similar manner, the output of the output multiplexer register 192 is applied to a differencing circuit 206 to provide field differencing data output for the odd rows, one detector column at a time.

Figure 11:
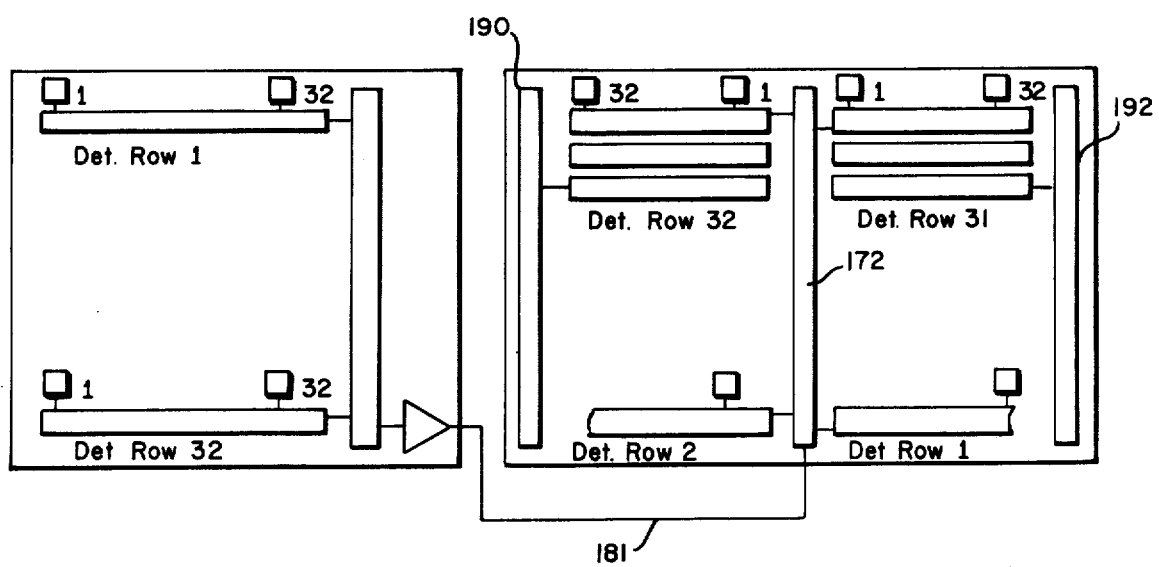
FIG. 11 is a schematic diagram for further explaining the off-focal plane processing system of FIGS. 9 and 10.

Referring now also to FIG. 11, the formatting of the data will be further explained. The row 1 and 2 sub-field data on the on-focal plane is transferred one row at a time, detector columns 32 to 1 through the lead 181 into the input multiplex register 172 off of the focal plane. Each row of detector data is transferred along the demultiplex registers and after integrating the sub-fields in the integrating registers and transferring both fields into the two field read out registers, column 32 of detector data is in the outward position of the left portions. The two fields are then transferred into the output multiplex registers starting with detector column 32 and ending with detector column 1. Thus, the column 32 data first transferred from the on-focal plane rows provides the first difference values and the column 1 data provide the last difference values.

Figure 12:
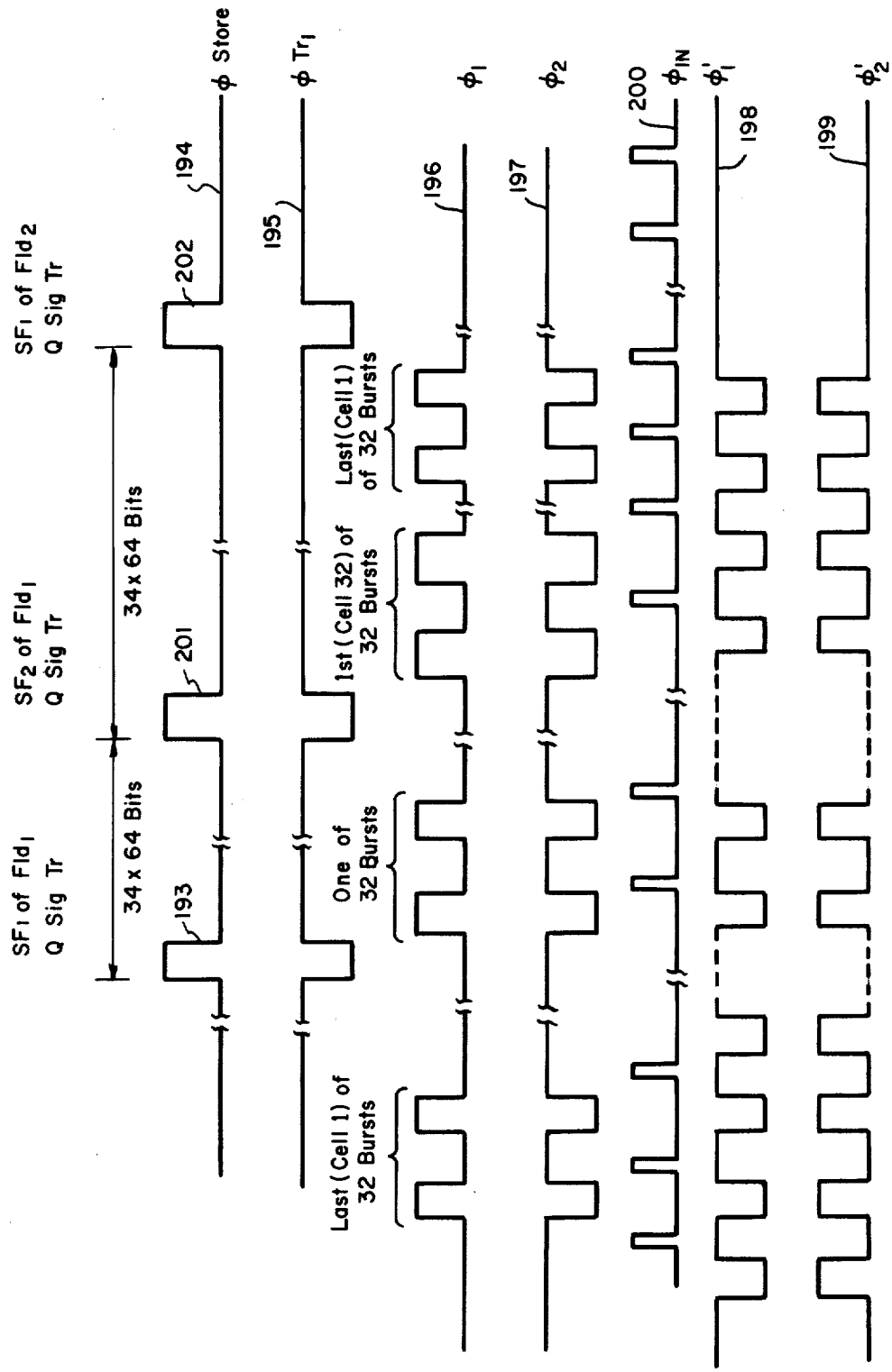
FIG. 12 is a schematic diagram of waveforms of voltage as a function of time for further explaining the operation of the off-focal plane system of FIGS. 10 and 11.

Referring now to FIG. 12 which shows the waveforms for controlling the on-focal plane registers of FIG. 9, the sub-field 1 of field 1 is integrated at the detectors to the left of a pulse 193 of a waveform 194 and in response to a $\phi_{store}$ pulse and a $\phi_{TR1}$ pulse of respective waveforms 194 and 195, the charges are transferred into the row registers. The sub-field 1 is then transferred into the second level multiplexer register 164 in bursts of two bits as shown by waveforms 196 and 197 with the detector column 32 data being first transferred. After each burst of two pulses, 64 clock pulses of the continuous pulses of waveforms 198 and 199 transfer the detector row data out of the register 164. The $\phi_{IN}$ pulses of a waveform 200 applies the fat zero charges to the row registers. During the period after pulse 193, the sub-field 2 of field 1 is being integrated at the detectors and at a pulse 201 time sub-field 2 is transferred into the row registers, all 32 columns of sub-field data having then been transferred out of the row registers and the multiplexer register 164. Again, in bursts of 2 pulses as shown by the waveforms 196 and 197, the columns 32 and 1 of data are transferred into the multiplex register 164 with each burst being followed by 64 transfer clocks of the waveforms 198 and 199. During this period after pulse 201, sub-field 1 of field 2 data is being integrated at the detectors and at a pulse 202, the charges for sub-field 1 are transferred into the row registers. Thus, sequential operation continues in a similar and continuous manner.

Figure 13:
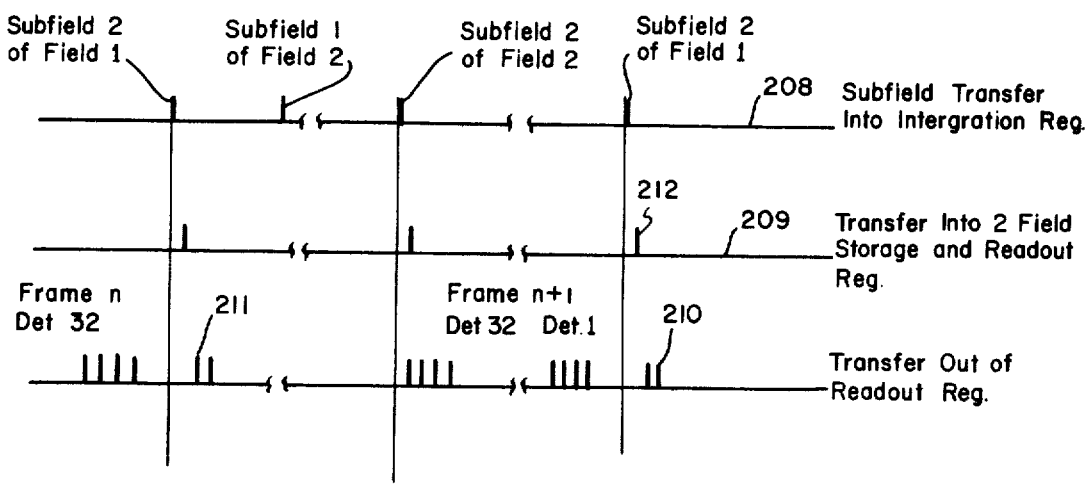
FIG. 13 is a schematic timing diagram for further explaining the transfers on the focal plane arrangement of FIG. 9.

Referring now to FIG. 13, as well as to FIG. 10, the operation of the off-focal plane registers including sub-field integration will be further explained. The sub-field transfer from the demultiplex registers such as 178 into the sub-field integration registers such as 186 is shown by the pulses of a waveform 208. The sub-field 2 of field 1 is transferred into the integration registers and a sub-field 1 has been previously transferred into the integration registers, the pulse of a waveform 209 transfers field 1 data into the readout registers such as 187. Two clock pulses 211 of a waveform 210 then shifts the data over 2 bit positions in the readout registers preparatory to receiving field 2 data after sub-field integration. After both sub-fields of field 2 are transferred and summed in the integration registers such as 186, field 2 is transferred into the readout registers such as 187 by a pulse 212 of the waveform 209. Sub-fields 1 and 2 are then transferred out of the readout register in response to bursts of 4 pulses starting with detector column 32 and ending with detector column 1. Between each burst of 4 pulses applied to the readout registers, 64 pulses are provided at the output multiplex registers such as 190 and 192 to transfer the fields 1 and 2 charges to the differencing circuits. The operation continues in a similar manner, integrating field 1, transferring field 1 into the readout register, shifting the field 1 data two bit positions in the readout register followed by integrating field 2 and transferring it into the readout register for transfer of both fields to the output multiplex registers in response to bursts of 4 pulses.

Figure 14:
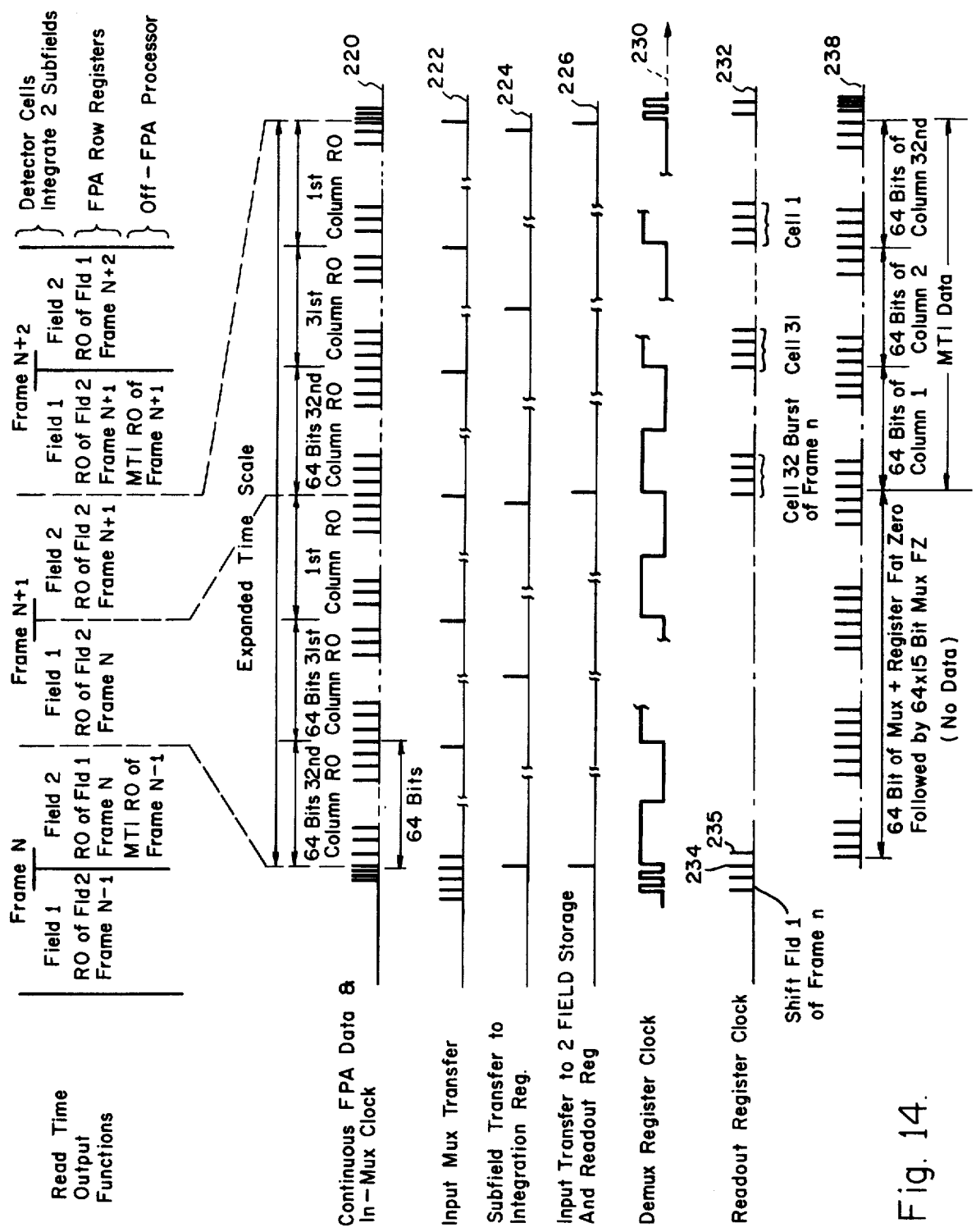
FIG. 14 is a schematic timing diagram for further explaining the operation of the off-focal plane processing system of FIGS. 9 and 10.

Referring now to FIG. 14, the real time output function of the detector cells for each frame N−1 to N+2 includes first integration of the sub-fields of field 1 and then integration of the sub-fields of field 2 as explained relative to FIG. 12. The output of the row registers as defined by the detector field and frame numbers, while the sub-fields of field 1 are being integrated, is a readout of the sub-fields of field 2 for frame N−1. During the time that the detector cells are being integrating for the sub-fields of field 2, the readout is for field 1 for frame N. The outputs of the output multiplexer registers 190 and 192 occurs only during the field 2 integration period of each frame, with a difference readout not being provided during the field 1 integration period. The input multiplexing register 172 which receives continuous data from the second level multiplexer 164 is shown by a waveform 220 with an expanded time scale for half of frames N and frames N+1 and it can be seen that during the readout of fields 1 and 2 from the row register, sequences of 64 bits for each detector column starting with detector column 32 is performed in a continuous fashion. The input multiplex transfer from the register 172 to the demultiplex registers such as 178 shown by waveform 222 is performed once for each detector column of data, transferring the entire column into the demultiplexing registers such as 178. The sub-field transfer to the integrating registers such as 182 is performed in response to pulses of a waveform 224 so that each sub-field is sequentially transferred thereto. The input transfer of the fields of data into the readout registers such as 187 and 188 is performed in response to the pulses of a waveform 226. The demultiplex register clock for the registers such as 178 and 180 is shown by the pulses of a waveform 230 as each column of detector data is transferred therein from the input multiplexer register 172. The readout register clock pulses of a waveform 232 shows that after transfer of field 1 into the readout registers, the data is shifted 2 bit positions as shown by pulses 234 and 235. The field 1 data is then retained and a difference output is not provided. The field 2 data, after transfer into the storage registers, such as 187 is then transferred in bursts of 4 bits into the output multiplexer registers which is continuous by operating in response to clock pulses of a waveform 238 so that the field 1 and field 2 data is alternately positioned in the registers separated by one isolation bit and is transferred to the differencing circuits 204 and 206. Thus, it can be seen that a continuous operation is provided and the sub-field data is reformatted in the demultiplexing registers such as 178 and 180 to be positioned with 1 bit of isolation between each data charge in the storage registers 186 and 188 and is then transferred into the output multiplexing registers 190 and 192. Fields 1 and 2 are alternately positioned with isolation bits therebetween for providing a simplified differencing arrangement in accordance with the invention.

Although the arrangements in accordance with the invention are illustrated to subtract the signals from two successive fields (first order differencing), the principles of the invention include higher order differencing by providing more bits in the storage and readout registers. For example, for second order differencing, a first and a second difference is developed between a detector signals F1 and F2 and between detector signals F2 and F3 and the second order difference is then developed with weighting such as in the output amplifier, between the first and second respective differences F1-F2 and F2-F3. For higher order differencing the bit transfer is arranged with additional bits in the storage and readout registers (for second order, three fields are stored) and with additional weighted differencing amplifiers at the output. Higher order differencing may be utilized to improve the low frequency rejection characteristics for slow moving scene backgrounds.

Thus, there has been described time change or moving target indication charge-coupled device processing systems that may be utilized with staring electo-optical sensors for example. Integration of the signal may be performed in integration buckets in storage buckets and different fields time are applied to CCD row channels and in turn to demultiplexing registers so that the different fields are adjacent to each other for transferring to a suitable differencing circuit or other suitable arrangement. The concepts of the invention are applicable either to on-focal plane processing or to off-focal plane processing. The off-focal plane processing arrangement allows further signal processing and sub-field integration off of the focal plane with the data from the different fields being reformatted so as to put alternate fields adjacent to each other for developing the difference or MTI functions. The systems of the invention have been illustrated with one isolation bit between signal charges but it is to be understood that any number of isolation bits or no isolation bits may be utilized within the scope of the invention. The concepts of the invention are applicable to any suitable charge transfer structure such as p-channel or n-channel CCD arrangements. Also it is to be understood that the principles of the invention are not to be limited to the illustrated CCD structure but also include all charge transfer devices such as bucket brigade structures.

What is claimed is:

1. A processor for determining changes of energy representative of the intensity of a scene, between first and second fields of said scene comprising:
   a plurality of current generating means for providing current representative of energy from said scene,
   a CCD storage channel having a plurality of first and second bit storage positions,
   integrating means including CCD storage buckets for integrating currents from said plurality of current generating means representative of signal data of each first and second field, said integrating means being each coupled to one of said plurality of current generating means and to a first bit storage position of said storage channel for transferring to said storage channel, signal data from said first and second fields,
   clock means coupled to said storage channel for shifting the signal data from the first to the second bit storage positions between transfer of signal data from a first field and signal data from a second field so that data from said first and second fields are respectively stored in said first and second bit storage positions, and for transferring the signal data to an output end of said storage channel when both fields are stored therein, and
   means including differencing means coupled to said output end of said storage channel for comparing signal data from said first and second fields.

2. A processor for determining changes between energy representative of the intensity of portions of first and second fields of a scene comprising:
   a plurality of means each including a source of current representative of the energy from said scene and including a CCD integrating bucket receiving current from said source of current for sequentially integrating charges representative of said first and second fields,
   a CCD storage register having a sequence of a plurality of first and second bit storage positions along said register, each first bit storage position coupled to a different integrating bucket for sequentially receiving signal charges from said integrating buckets for said first and second fields, each of said bit storage positions of said sequence having at least one isolation bit position between each of said bit storage positions of said sequence,
   means for shifting the signal charges in said storage register from the first to the second bit positions after receiving said signal charges from said first field from said integrating buckets,
   means for shifting the signal charges of said first and second fields in said storage register to an output end of said storage register, and
   means coupled to the output end of said storage register for comparing the shifted signal charges from said first and second fields.

3. A moving target indicator system comprising:
   a plurality of rows of detectors receiving first and second fields of data,
   a plurality of rows of CCD shift registers having a plurality of bit positions with each detector in each row coupled to each fourth bit position in the corresponding shift register row,
   charge storage means coupled between each detector and the row shift register for integrating the first and second fields of data before being transferred into said rows of shift registers,
   an output CCD shift register having a plurality of bit positions with each fourth bit position coupled to receive an output from a different row of shift registers,
   control means coupled to said plurality of rows of CCD shift registers to provide signals so that first and second fields of data are alternately transferred from said detectors to said rows of shift registers and including clock means coupled to said rows of shift registers for shifting the signal charges two bit positions between transfer of said first and second fields of data, said control means coupled to said output CCD shift register for providing signals so that each fourth bit position of said output CCD shift register receives an output from a different row of shift registers, and
   differencing means coupled to an output end of said output shift register for comparing the values of sequential pairs of second bit positions.

4. A system for determining changes between first and second fields in a scene comprising:
   a plurality of rows of detectors,
   a plurality of rows of CCD registers each having a plurality of first and second storage units with each storage unit having first and second bit positions,
   integrating means for integrating signal data of each field and coupled between each detector of each row of detectors and the first bit positions of the first storage units of corresponding rows of said plurality of rows of registers for receiving signal current from the detector representative of said signal data,
   means for transferring the integrated signal data of said first and second fields to the plurality of rows of registers, clocking means coupled to said plurality of rows of registers for shifting signal data from the first storage units to the second storage units between transfer of said first and second fields thereto, an output CCD register having a plurality of first and second storage units, each storage unit having first and second bit positions, each first storage unit of said output register coupled to an output of said plurality of rows of registers, and differencing means coupled to an output end of said output register for comparing the signal data of said first and second fields.

5. A time change determining processor for comparing energy representative of the intensity of a scene during first and second field times comprising:

a CCD storage register sequentially having a plurality of first and second bit storage positions for storing signal charges representative of said scene, integrating means coupled to the first bit storage positions for providing storage charges to said storage register, a plurality of sources of current coupled to said integrating means, said plurality of sources of current providing said signal charges representative of said scene to said integrating means, clock means coupled to said storage register for transferring said signal charges from said first storage positions to said second storage positions between first and second field times so that adjacent signal charges substantially represent the same portion of the scene, and for transferring said signal charges to an output end of said storage register when the charges from said first and second fields are in said storage register, and means including differencing means coupled to the output end of said storage register for comparing the value of adjacent signal charges.

6. A system for determining changes of portions of a scene between first and second fields, each field including a plurality of sub-fields comprising:

a plurality of detectors for receiving signals from said scene,

CCD storage means having a plurality of bit positions, integrating means including CCD storage buckets for integrating each sub-field and coupled from each detector to selected bit positions of said storage means, CCD demultiplexer means coupled to said storage means, CCD integration means having a plurality of bit positions and coupled to said demultiplexer means, readout means coupled to said CCD integration means, multiplexer means coupled to said readout means, differencing means coupled to said multiplexer means, and clock means coupled to said storage means and to said demultiplexer means for providing clock signals for transferring each sub-field signal data to said demultiplexer means, coupled to said CCD integration means for providing clock signals for integrating the sub-fields to form fields from each detector in bit positions with said first and second fields in sequential positions and for transferring said first and second fields to said readout means and coupled to said multiplexer means for transferring said first and second fields to said differencing means.

7. A system for determining changes between first and second fields of a scene, said first and second fields each including a plurality of sub-fields comprising:

a plurality of rows of detectors, said rows of detectors forming columns of detectors, a plurality of rows of CCD registers each coupled to a row of detectors and each having a plurality of bit positions for receiving data, a first CCD register coupled to said plurality of rows of registers, a second CCD register coupled to said first register, a plurality of CCD row register means coupled to said second register each including an integrating register and a readout register, CCD output register means coupled to the readout registers of said plurality of row register means for receiving data of the first and second fields in sequence from each detector, and differencing means coupled to said output register means for sequentially comparing data of the first and second fields from each detector.

8. The combination of claim 7 further including integrating means coupled between each detector and the plurality of rows of registers.

9. The combination of claim 8 in which clock means is provided to sequentially transfer the data of each subfield from the plurality of row registers sequentially to said first and second registers in sequential columns of data, and is provided to integrate the data of the subfields in the integrating registers, to transfer the data of each field to the readout register with the data of the first and second fields from each detector being sequential and to transfer the data of each field in the readout registers to said output register means and to said differencing means.

10. The combination of claim 9 in which said detectors have a detector focal plane and the plurality of rows of detectors, the plurality of rows of registers and said first register are at said detector focal plane.

* * * * *